United States Patent [19]
Anayama et al.

[11] Patent Number: 5,375,136
[45] Date of Patent: Dec. 20, 1994

[54] SEMICONDUCTOR LASER OF PATTERNED-SUBSTRATE TYPE AND STRUCTURE THEREOF

[75] Inventors: Chikashi Anayama; Toshiyuki Tanahashi; Makoto Kondo, all of Kawasaki, Japan

[73] Assignee: Fujitsu Limited, Kawasaki, Japan

[21] Appl. No.: 226,050

[22] Filed: Apr. 11, 1994

Related U.S. Application Data

[62] Division of Ser. No. 76,790, Jun. 15, 1993, Pat. No. 5,336,635.

[30] Foreign Application Priority Data

Jun. 24, 1992 [JP] Japan .................. 4-165157

[51] Int. Cl.⁵ ............................... H01S 3/19
[52] U.S. Cl. ............................ 372/46; 372/45
[58] Field of Search ............. 372/46, 45, 47, 43

[56] References Cited

U.S. PATENT DOCUMENTS 5,255,281  10/1993  Sugano et al. ............. 372/46

FOREIGN PATENT DOCUMENTS

| 0454476 | 6/1992 | European Pat. Off. . |
| 56-36182 | 4/1981 | Japan . |
| 57-132384 | 8/1982 | Japan . |
| 60-1879 | 4/1985 | Japan . |
| 60-258986 | 11/1987 | Japan . |
| 60-258991 | 11/1987 | Japan . |

OTHER PUBLICATIONS

Guotong Du, Xiabo Zhang, Fanghai Zhao and Dingsan Gao, IEEE Journal of Quantum Electronics, "Terraced Substrate Inner Stripe Visible Semiconductor Laser and Its Arrays", vol. 26, No. 3, Mar. 1990.

Jun-ichi Hashimoto, Tsukuru Katsuyama, Jiro Shinkai, Ichiro Yoshida and Hideki Hayashi, Applied Physics Letters, "Effects of Strained-Layer Structures on the Threshold Current Density of AlFaInP/FaInP Visible Lasers", 58(9), 4 Mar. 1991.

A. Furuya, M. Kondo, M. Sugano, T. Anayama, K. Domen, T. Tanahashi and T. Mikawa, Electronics Letters, "Small Beam Astigmatism of AlGaInP Visible Laser Diode Using Selfaligned Bend Waveguide", vol. 28, No. 12, 4 Jun. 1992.

Primary Examiner—Georgia Y. Epps
Attorney, Agent, or Firm—Staas & Halsey

[57] ABSTRACT

A semiconductor laser of a patterned-substrate type comprises the patterned-substrate having a sloped portion and a planar portion, and a plurality of semiconductor layers formed on the patterned-substrate including a heterostructure. By controlling condition for growing a specific semiconductor layer, a preferably ratio of a sloped portion thickness to a planar portion thickness of the semiconductor layer can be obtained, which enables a lasing current of the laser to be confined in a restricted region, and this results in obtaining a high efficiency and a high power output of the semiconductor laser.

6 Claims, 9 Drawing Sheets

1

SEMICONDUCTOR LASER OF PATTERNED-SUBSTRATE TYPE AND STRUCTURE THEREOF

This application is a division of application Ser. No. 08/076,790, filed Jun. 15, 1993 now U.S. Pat. No. 5,336,635.

BACKGROUND OF THE INVENTION

1. Field of the Invention

The present invention relates to a method of manufacturing semiconductor lasers and structure thereof. More particularly, this invention relates to a method of manufacturing semiconductor lasers in which a patterned-substrate is used.

Present-day semiconductor lasers are required to have lower oscillation threshold current, higher efficiency and higher power output. Semiconductor lasers utilizing compound semiconductor material such as GaInP and AlGaInP group can emit visible lasing light of 0.6 $\mu$m wavelength and are useful as a light source in POS (Point of Sales) terminals, optical disk apparatus, and laser printers.

2. Description of the Related Art

A semiconductor laser as described above, comprising an AlGaInP-GaInP-AlGaInP double-heterostructure is well known.

A typical prior art semiconductor laser of an AlGaInP-GaInP-AlGaInP double-heterostructure type is disclosed in Japanese Unexamined Patent Publication Tokkai-SHO 62-200786. A cross sectional view of this type is shown in FIG. 1. On an n-GaAs substrate 21, a double-heterostructure of an n-AlGaInP lower clad layer 22, a GaInP active layer 23 and a p-AlGaInP upper clad layer 24 which includes a mesa-stripe 24a are formed in this order. Current-blocking layers 26 of n-GaAs are formed on the upper clad layer 24 so as to bury the mesa-stripe 24a, and a p-GaInP contact layer 25 and a p-GaAs contact layer 27 are formed on the mesa-stripe 24a, and a p-GaAs contact layer 28 covers the entire underlying structure.

In the above structure, the mesa-stripe 24a of p-AlGaInP upper clad layer 24 has a function of guiding the lasing light; however, the current-blocking layers 26 on both (i.e., the opposite) sides thereof work as a loss-guide. The semiconductor laser of this type, therefore, is undesirable because a high efficiency and high power output can not be expected.

As another type of semiconductor lasers of the prior art, a buried heterostructure type is known, in which a AlGaInP-GaInP-AlGaInP double heterostructure is etched until a stripe-shaped ridge is formed, and the removed portions on both sides of the stripe-shaped ridge are buried with current-blocking layers. However, this type also presents difficulties in fabrication steps.

To solve the above problems, a semiconductor laser structure of the patterned-substrate type shown in FIG. 2 is proposed by Japanese Patent Application Tokugan-Hei 3-92341 having priority date of Jun. 20, 1990. (The same patent was filed as U.S. patent application Ser. No. 691620 dated Apr. 25, 1991, and also filed as European Patent Application No. 91-303783.4). In the application, an AlGaInP-GaInP-AlGaInP double heterostructure is formed on the patterned-substrate having a mesa stripe 31a of a p-GaAs substrate 31 and n-GaAs current blocking layers 32. On the patterned-substrate, a p-AlGaInP spike reduction layer 33, a p-AlGaInP lower clad layer 34, a GaInP active layer 35, an n-AlGaInP upper clad layer 36 and an n-GaAs contact layer 37 are formed in this order. Each of these stacked layers forming a heterostructure has downward inclination on both sides of the mesa-stripe 31a, thereby forming a gradual slope which continues to a comparatively flat layer. The structure does not include a loss-guide structure, and control of transverse lasing mode is attained by a bent shape of the heterostructure.

In conjunction with the laser structure of the above patterned-substrate type, Japanese Unexamined Patent Publication Tokkai-Hei 4-133315 discloses a method of improving a shape of the patterned-substrate having the GaAs substrate 31 with the mesa stripe 31a and the current-blocking layers 32 on the substrate 31 shown in FIG. 2. A $SiO_2$ layer is first deposited on a flat original GaAs substrate, and next, the $SiO_2$ layer is patterned in a stripe shape and, thereafter, the substrate is subjected to a wet-etching process using, for example, a mixed solution of $H_2SO_4$, $H_2O_2$ and $H_2O$. Next, the n-GaAs current blocking layers 32 are deposited thereon by a MOVPE (Metal Organic Vapor Phase Epitaxy) method.

The semiconductor lasers of the patterned-substrate type have capabilities of high efficiency and high power output, however, a current confining function is not satisfactory because the vertical lasing current through the stacked layers is apt to spread outwardly in the transverse direction. Further, the heterostructure above the mesa-stripe 31a (lasing portion) is not formed of ideal flat layers but it instead comprises small undulation which causes splitting of the transverse lasing mode with the result of deteriorating a far field pattern of the lasing light.

SUMMARY OF THE INVENTION

An object of the present invention is to provide a manufacturing method and a structure of the semiconductor laser of the patterned-substrate type, in which a current confining characteristic is well controlled and a lasing region is stable.

Another object of the present invention is to provide a semiconductor laser of the patterned-substrate type having a low threshold current, a high efficiency and a high power output.

Still another object of the present invention is to provide a manufacturing method of a semiconductor laser of the patterned-substrate type, in which a grown clad layer above the patterned substrate has a predetermined thickness ratio, the ratio being defined for a sloped portion thickness to a planar portion thickness of the grown layer.

The above objects are achieved by a manufacturing method of the present invention which can be applied to both species of the semiconductor lasers of the patterned-substrate type, a first species having a lasing region on a planar portion of the patterned-substrate and a second species having a lasing region on a sloped portion of the patterned-substrate, and the method characterized by the following features.

One method of the invention is applied to the first species of semiconductor lasers, the method including a step of growing current-blocking layers on a planar portion of a substrate and on both side surfaces of a mesa-stripe on the substrate. Thus the patterned-substrate is formed having the current-blocking layers with a gentle sloped surface without depression, thereby resulting in a planar structure of the heterostructure on the top of the mesa-stripe without undulation.

Another method of the invention is also applied to the first species of semiconductor lasers, the method including a step of growing lower and/or upper clad layers, wherein a thickness ratio A/B of the clad layer having a predetermined value, for example, within a range from 1 to 2 can be obtained, where A is defined as a thickness at the sloped portion and B is defined as a thickness for the planar portion of the grown layer.

Still another method of the present invention is applied to a second species of semiconductor lasers of patterned-substrate type, wherein a sloped portion of an active layer emits lasing light. In the similar way as in the first species, a thickness ratio of a sloped portion to a planar portion of a clad layer lying close to the active layer is controlled so as to have a predetermined value, thereby the lasing portion in the active layer is well controlled without fluctuation.

Other objects and advantages of the present invention will become more apparent from the detailed description to follow taken in conjunction with the appended claims.

BRIEF DESCRIPTION OF THE DRAWINGS

FIGS. 3(a) through 3(d) show a cross sectional view of sequential steps during fabrication of a semiconductor laser in accordance with the present invention for a purpose of explaining the principle of a manufacturing method of the present invention.

FIG. 6(a) shows schematically that split transverse lasing modes are liable to occur, however, FIG. 6(b) shows a single transverse mode is generated.

FIG. 7(a) is obtained by changing growth temperatures with constant V/III ratio of 100, and FIG. 7(b) is obtained by changing V/III ratio with constant growth temperature of 720° C.

FIGS. 8(a) through 8(c) show cross sectional views at different manufacturing steps of a semiconductor laser according to an embodiment of the present invention.

FIG. 9 through FIG. 13 are related with the second species of semiconductor lasers of the patterned-substrate type of the present invention.

FIG. 9 shows a schematic cross section of a semiconductor laser of the patterned-substrate type in the second species.

FIG. 11 shows a geometrical analysis to determine a thickness ratio of the upper clad layer.

FIG. 12 shows measured data of thickness ratio R by changing a substrate temperature during growth, while V/III ratio is maintained at 180 and 330.

FIG. 13 shows a cross sectional view of a semiconductor laser in Embodiment 2 in accordance with the present invention.

DETAILED DESCRIPTION OF THE PREFERRED EMBODIMENTS

The principle of the manufacturing method in accordance with the present invention is first described on a semiconductor laser of the patterned-substrate type classified in the first species. FIGS. 3(a)–3(d) through FIGS. 8(a)–8(c) are related with the first species.

Figure 1:
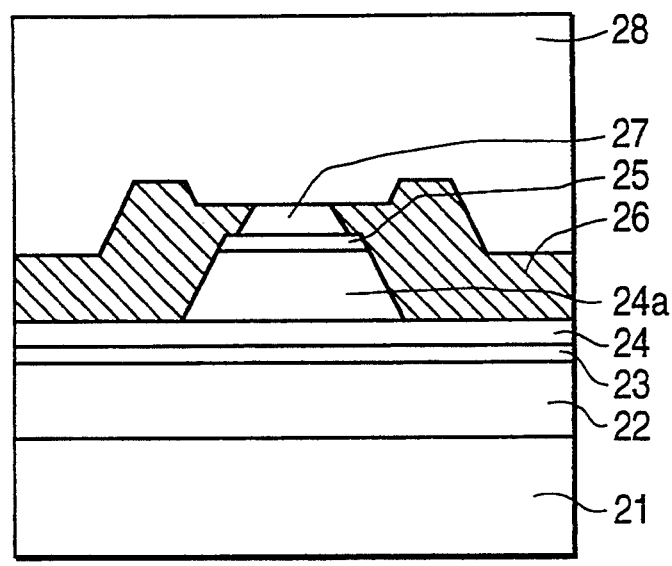
FIG. 1 shows a cross sectional view of a semiconductor laser comprising an AlGaInP-GaInP-AlGaInP heterostructure of the prior art.
Figure 2:
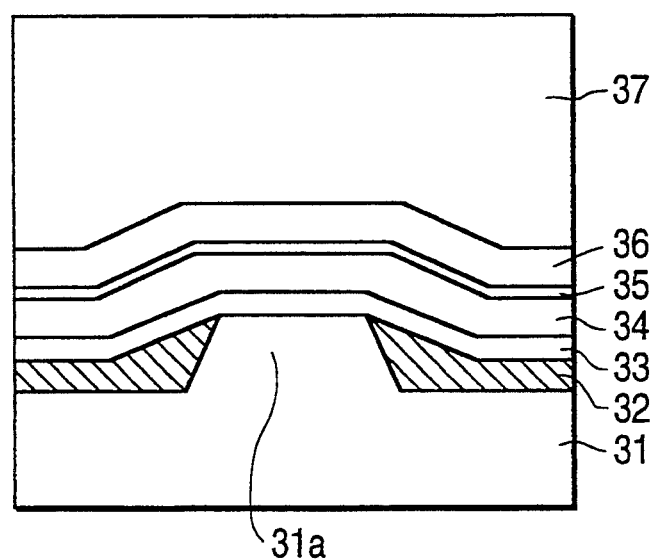
FIG. 2 shows a cross sectional view of another semiconductor laser of the patterned-substrate type comprising an AlGaInP-GaInP-AlGaInP heterostructure in order to explain the prior art manufacturing method and problems thereof.
Figure 3A:
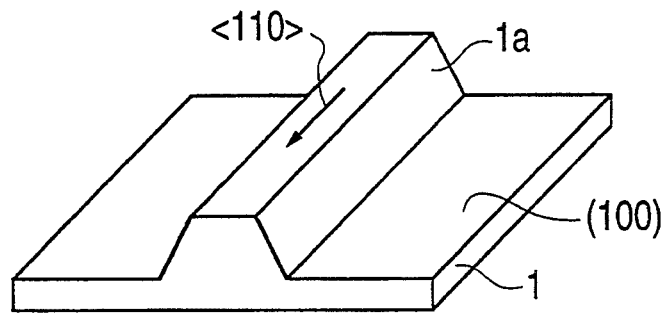
FIGS. 3(a)–3(d) through FIGS. 8(a)–8(c) are related with a first species of semiconductor lasers of the patterned-substrate type of the present invention.

The patterned-substrate type laser of the present invention requires a substrate 1 with a mesa-stripe 1a, as shown in FIG. 3(a). In order to obtain the substrate 1 of this shape, an original flat substrate of GaAs having a (100) surface is provided, and a $SiO_2$ layer is deposited on the (100) substrate surface by sputtering. The $SiO_2$ layer is selectively patterned by photolithography leaving a stripe pattern 2 of $SiO_2$ layer, with the stripe pattern being formed in the <110> direction of the (100) GaAs substrate.

It is known that surface and direction of a crystal, though they are expressed by different indices, comprise the equivalent surfaces and directions in crystallography, therefore, all equivalent surfaces and directions are expressed by a representative surface index and direction in the description of the embodiment.

Figure 3B:
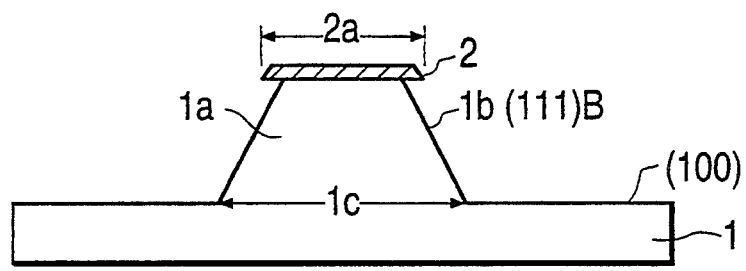

Using the stripe-shaped $SiO_2$ layer 2 as a mask, the substrate is subjected to a wet etching process, which results in forming the substrate 1 with the mesa-stripe 1a having a height of about 1.8 μm as shown in FIG. 3(b). There appears a (111)B surface on both sides of the mesa-stripe 1a.

In the above step, a width 2a of the $SiO_2$ mask 2 is selected to be less than a bottom width 1c of the mesa-stripe 1a, and the mask 2 preferably protrudes outwardly beyond the top width of the mesa-stripe. The outward protruding length is selected to be about 0.2 μm.

Figure 3C:
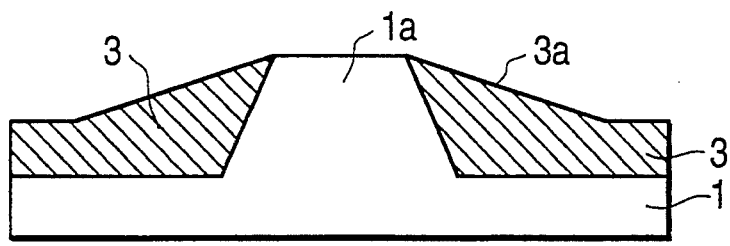

In FIG. 3(c), using the mask 2, current-blocking layer 3 is grown on level surfaces of the substrate 1 and on both side surfaces of the mesa-stripe 1a by a MOVPE method. Trimethyl-gallium $(CH_3)_3Ga$ (hereinafter abbreviated briefly as TMG) and arsine $AsH_3$ are used as source gases, and further a doping gas, for example, $SeH_2$ is introduced if a negative-type GaAs growth is required.

After the patterned-substrate comprising the substrate 1 with the mesa-stripe 1a and the current-blocking layers 3 is produced in this way, the $SiO_2$ mask layer 2 is removed by wet-etching using hydrofluoric acid HF, and a structure of FIG. 3(c) is obtained.

Figure 3D:
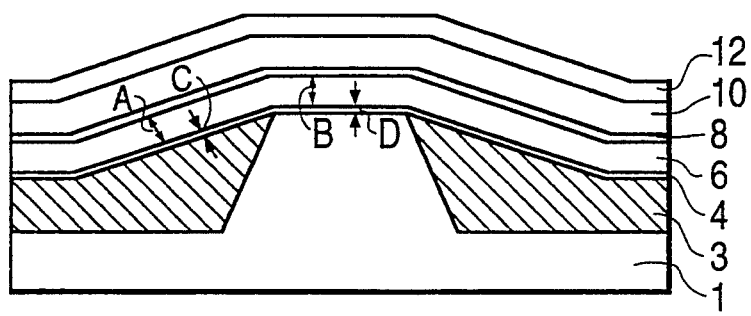

In FIG. 3(d), a buffer layer 4 of GaAs, a lower clad layer 6 of AlGaInP, an active layer 8 of GaInP, an upper clad layer 10 of AlGaInP and a contact layer 12 of GaAs are grown on the patterned-substrate. Only five layers are shown in FIG. 3(d) for a purpose of simplifying the explanation. With regard to a polarity type of these layers, the substrate 1, the buffer layer 4 and the lower clad layer 6 are of a first polarity type, and the upper clad layer 10, the contact layer 12 and the current blocking layer 3 are of a second polarity type opposite to the first polarity type. Detailed composition and structure are described in the subsequent description on the actual embodiment.

Figure 4A:
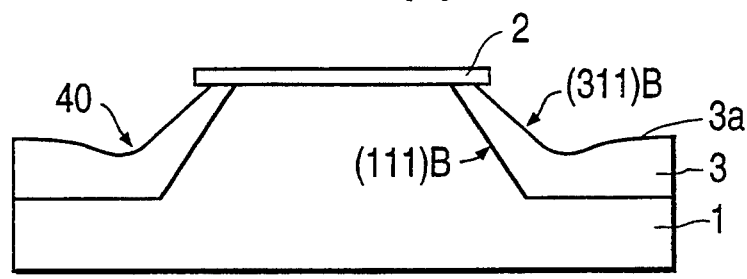
FIGS. 4(a) and 4(b) show a cross sectional view of the patterned-substrate alone, wherein current-blocking layers of FIG. 4(a) have a depression on its surface but current-blocking layers of FIG. 4(b) formed by the present invention have a gently sloped surface with less inclination.

Generally, trimethyl-gallium TMG and triethyl-gallium $(C_2H_5)_3Ga$ (hereinafter abbreviated briefly as TEG) are known as a source gas for growing a gallium compound semiconductor layer but, if the TEG is used for growing current-blocking layer 3, depressions 40 as shown in FIG. 4(a), are formed on surface 3a of the grown current-blocking layer 3 of GaAs. The grown surface 3a gradually slopes down from the top of the mesa-stripe, the sloped surface being close to a (311)B surface and continues to a comparatively flat surface, thereby forming the depression 40 therebetween. The depression thus formed becomes a main cause of splitting of the transverse lasing mode and deteriorates a far field pattern of the lasing light when the heterostructure is subsequently formed thereon.

Figure 6A:
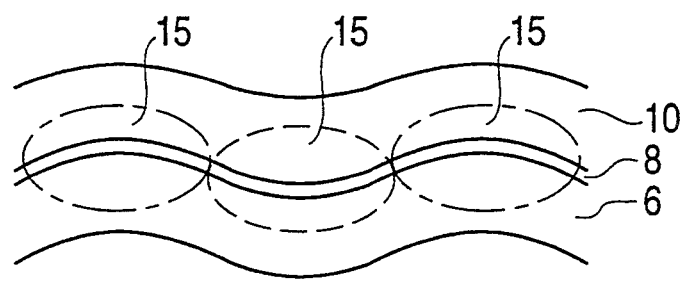
FIGS. 6(a) and 6(b) show a cross sectional view of an enlarged lasing portion of the heterostructure.
Figure 5A:
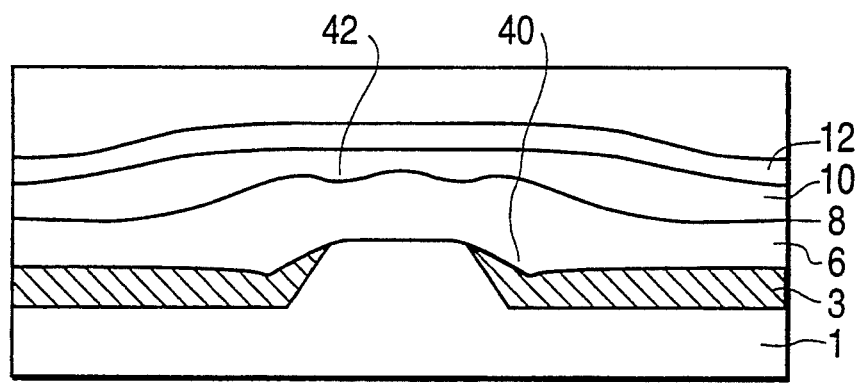
FIGS. 5(a) and 5(b) show a cross sectional view of a heterostructure grown on the patterned-substrate, thereby undulation being formed in heterostructure of FIG. 5(a), and no undulation being observed in FIG. 5(b).

When the heterostructure is grown on the patterned-substrate of FIG. 4(a), undulation 42 caused by the depression 40 is observed in the heterostructure, as shown in FIG. 5(a). When the laser structure of this type is used in application, transverse mode splitting will occur. FIG. 6(a) shows a partial cross section of the heterostructure alone of the lower clad layer 6, the active layer 8 and the upper clad layer 10. The FIG. 6(a) schematically shows the transverse mode of the lasing light 15 is split into three patterns.

Figure 4B:
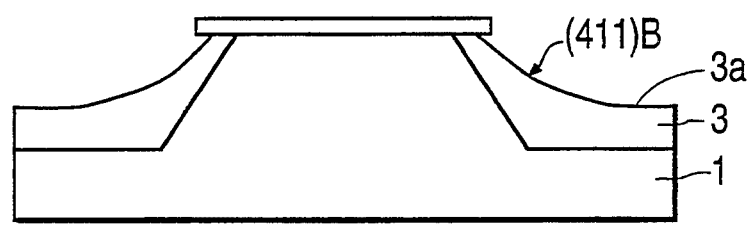
Figure 6B:
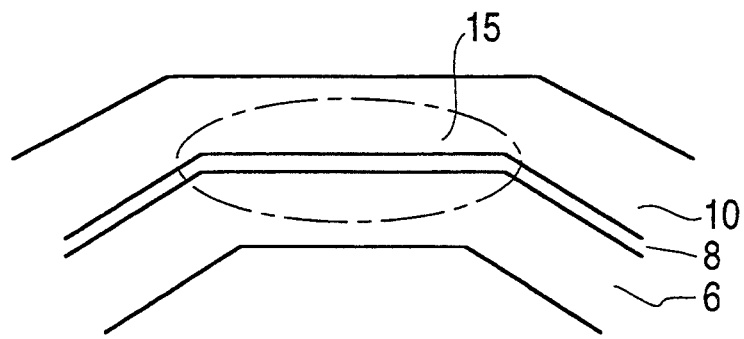
Figure 5B:
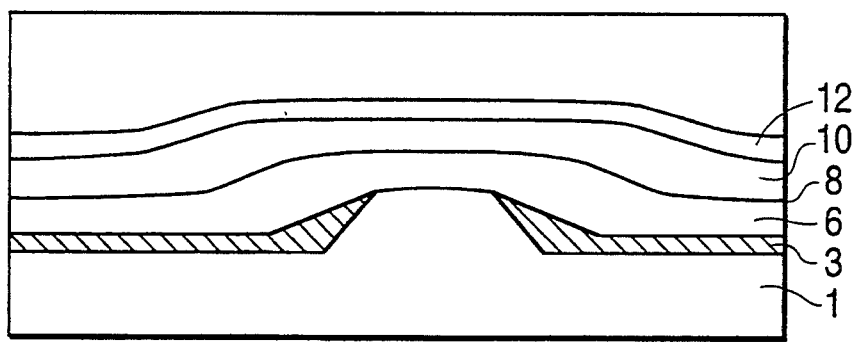

In accordance with the present invention, the TMG gas is intentionally used for the growth of the GaAs current-blocking layer 3. In FIG. 4(b), slope of the grown surface 3a becomes more moderate, and the surface is a slightly curved surface with the surface inclination being close to a (411)B surface of the substrate 1 having a (100) surface. Since conspicuous depression 40 disappears on the surface, the heterostructure formed on the thus formed patterned-substrate comprises flat layers on the mesa-stripe without undulation. FIG. 5(b) shows schematically the thus formed heterostructure, and the transverse mode of the lasing light is shown in FIG. 6(b) in which a single mode alone appears.

In order to achieve the objects of the present invention and realize improved characteristics of the semiconductor lasers, we found that, in the semiconductor laser of the patterned-substrate type, it is an important factor to select a thickness ratio of a specific semiconductor layer at an optimum value, the ratio being defined for the sloped portion to the planar portion of the semiconductor layer.

First, the buffer layer 4 of FIG. 3(d) which is directly deposited on the patterned-substrate should have a sufficiently high electrical resistance on the current blocking layer 3 but have a low electrical resistance on the mesa-stripe since a carrier depletion layer is formed at an interface between the buffer layer 4 and the current-blocking layer 3. It is desirable that the buffer layer on the current blocking layer 3 works as a high resistance layer caused by the carrier depletion but not have too much resistance on the mesa-stripe 1a. As the compromise, we found an impurity concentration of $1 \times 10^{17}$ cm$^{-3}$ and a thickness of 50 nm on the mesa-stripe 1a is preferable as the buffer layer 4. A thickness ratio C/D of the buffer layer 4 shown in FIG. 3(d) is selected to be less than 1, where C denotes a thickness at the sloped portion of the buffer layer 4 and D denotes a thickness thereof above the mesa-stripe 1a. The ratio C/D of less than 1 means the buffer layer 4 on the mesa-stripe 1a has a required thickness but a thickness on the current-blocking layer 3 preferably decreases as much as possible.

Second, a thickness ratio A/B is defined for the lower clad layer 6, the upper clad layer 10, and the contact layer 12, where A denotes a thickness at the sloped portion of each layer and B denotes a thickness thereof above the mesa-stripe in the similar way as the ratio C/D. It is desirable that the grown layers have an appropriate value of ratio A/B. The symbol A/B is used for the growth of AlGaInP clad layers 6, 10 and GaAs contact layer 12.

Our experiments showed it is preferable that the ratios A/B for the lower and upper clad layers 6, 10 are selected in a range between 1 and 2. This results in increasing an electrical resistance in the thickness direction at the sloped portions of each layer, thereby preventing an electrical resistance above the mesa-stripe from increasing. As the result, laser current flow is more concentrated in the lasing portion above the mesa-stripe 1a.

Figure 7A:
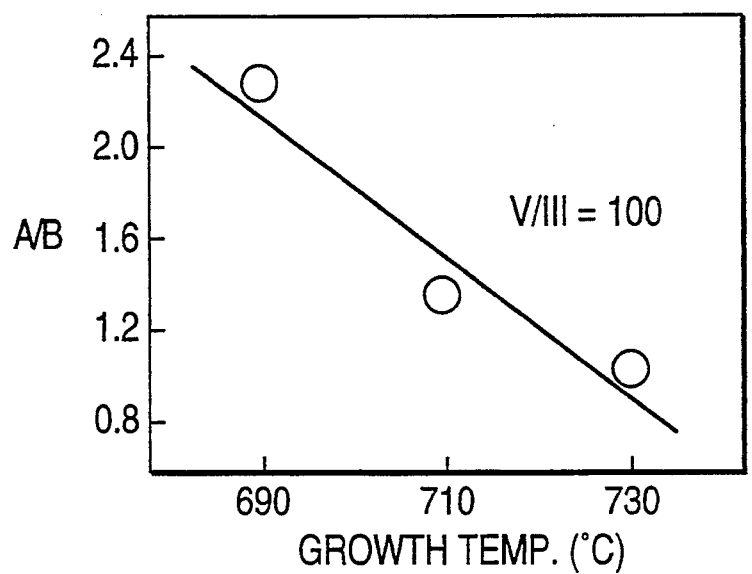
FIGS. 7(a) and 7(b) show measured data of ratio A/B, where
Figure 7B:
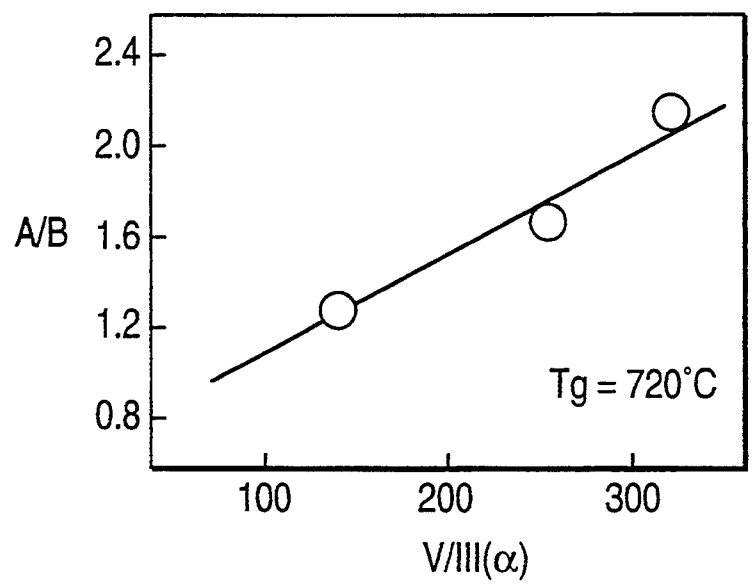

In growing an AlGaInP-GaInP-AlGaInP heterostructure on the patterned-substrate, the ratio A/B of the grown layers varies depending on a source gas ratio α (V/III: a flow ratio of a group V source gas to sum of group III source gases) and a substrate temperature Tg during growth. An example of measured data is shown in FIGS. 7(a) and 7(b). FIG. 7(a) shows measured data of the relation between A/B and growth temperature, where α is fixed at 100. FIG. 7(b) shows measured data of the relation between A/B and α, with the growth temperature fixed at 720° C. The data in both FIGS. 7(a) and 7(b) is obtained under the constant conditions of Pg=50 Torr, E=800 μm/mol and Ft=8 SLM (standard liter per minute), where Pg denotes a gas pressure in the growth chamber, E denotes a growth efficiency (thickness of grown layer per unit mol of group III source gas supplied), and Ft denotes total gas flow amount. A phosphine gas is used as the group V source gas, and TEG, trimethyl-indium (abbreviated briefly as TMI) and trimethyl-aluminum (abbreviated briefly as TMA) gases are used as the group III source gases.

From the measured data, the following relation is obtained, $$A/B = 0.0039\alpha - 0.035Tg + 26.05, \quad (1)$$

where Tg denotes growth temperature in °C.

In order to satisfy the condition of $1 < A/B < 2$, α and Tg are required to satisfy the following relation, $$-25.05 < 0.0039\alpha - 0.035Tg < -24.05 \quad (2)$$

If the gas pressure Pg (Torr), the growth efficiency E (μm/mol), and/or the total gas flow Ft (SLM) are changed, α value applied to the above relation (2) is to be modified by inserting the following α value into equation (2), $$\alpha = 128 \times \alpha' \times Pg/(E \times Ft), \quad (3)$$

where $\alpha'$ denotes V/III ratio which is necessary in the growth apparatus under modified growth conditions.

The above relations are obtained for growing semiconductor layers of AlGaInP and GaInP, in which a phosphine ($PH_3$) gas is used as a group V source gas. In case of growing a GaAs layer, where arsine ($AsH_3$) gas is required as a source gas, the above relations can not be applied.

In growing a GaAs semiconductor layer, the C/D ratio for the buffer layer 4 and the A/B ratio for the contact layer 12 are more dominated by the kind of group III source gas rather than the V/III ratio. In growing the GaAs buffer layer 4, the C/D ratio of less than 1 is preferable, as previously described. This condition can be achieved by using a TEG gas as the group III source gas. In growing the GaAs contact layer 12 of FIG. 3(d), on the other hand, the use of a TMG gas is desirable. In this case, the A/B ratio of greater than 2 can be obtained, namely, a comparatively flat grown surface of the contact layer 12 can be obtained. After forming an upper electrode on the contact layer 12, the thus formed flat surface alleviates strain caused by a subsequent bonding process and contributes to improve reliability of the lasers.

Herein it is noted again that, in the semiconductor laser of the patterned-substrate type, it is an important factor to select a thickness ratio of a specific semiconductor layer at an optimum value, the ratio being defined for the sloped portion of a grown layer to the planar portion thereof. This principle can be applied to the second species of semiconductor lasers other than those in the first species.

Figure 9:
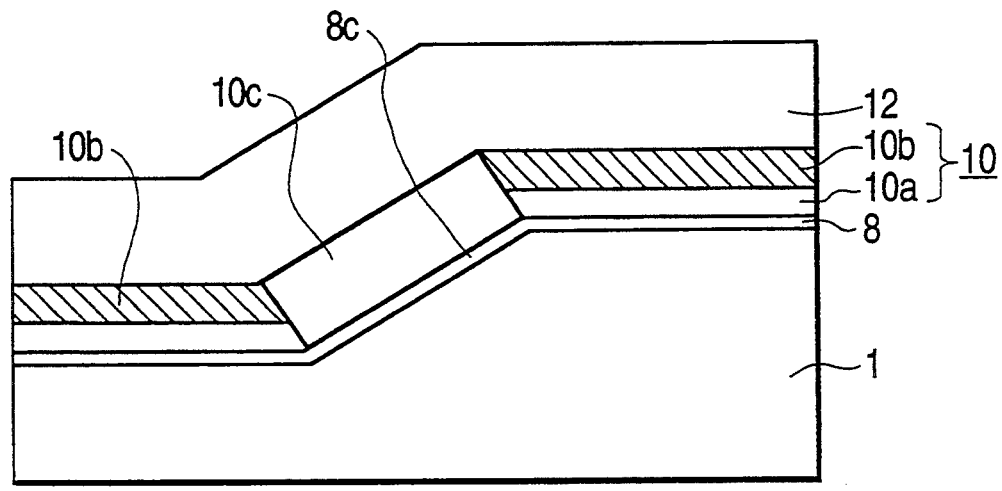

FIG. 9 shows a schematic cross section of a semiconductor laser with patterned-substrate in the second species. In FIG. 9 through FIG. 13, the same reference numerals designate the same or like parts used in the first species, therefore, detailed descriptions thereof are omitted. Reference numerals 10a, 10b, 10c denote portions of an upper clad layer 10. The layer portion 10b has a function of a current blocking layer.

In the semiconductor laser in the second species shown in FIG. 9, a laser current flows to an active layer 8 through the sloped layer portion 10c. Although the entire sloped portion 8c of the active layer 8 can emit lasing light, injection laser current should be injected uniformly onto the entire surface of the sloped portion 8c.

Figure 10A:
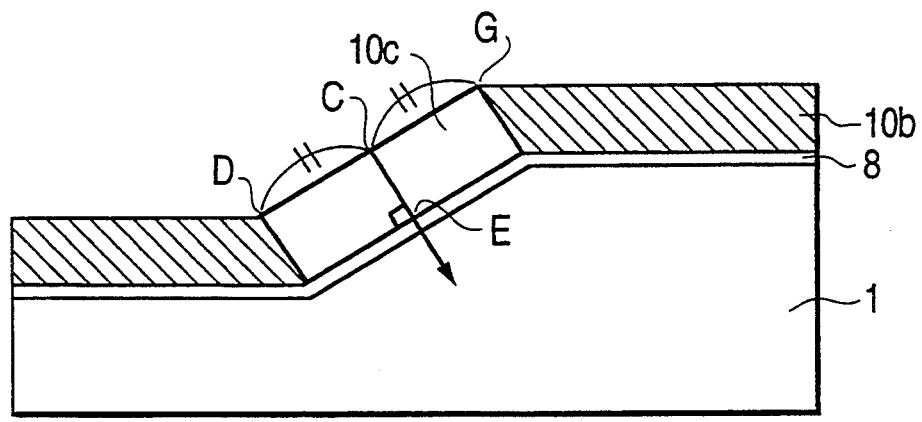
FIGS. 10(a) and 10(b) show a cross sectional view of upper clad layer, active layer and patterned substrate, wherein thickness ratios of the clad layers are different in FIGS. 10(a) and 10(b), thereby causing current injection modes to change.

FIG. 10(a) is a similar cross section as FIG. 9 with a purpose of explaining flow condition of the injection current. Point C is assumed as the middle point of line DG. Line CE (in an actual structure, CE is a plane vertical to the drawing sheet, however, the term "line CE" is used for simplicity) divides the layer portion 10c vertically into two, and the injected current flows on both sides of line CE and centered to the line CE because the direction CE indicates the shortest path to the active layer 8.

Theoretically, if the point E (length CE is the shortest distance from point C to the active layer) is at the middle point of the sloped portion of the active layer 8, the center of the lasing light should be at the middle point of the active layer 8. In actual cases, it is very difficult to keep the lasing center at the middle of the sloped portion of the active layer 8. The lasing center frequently moves in the active layer 8.

Figure 10B:
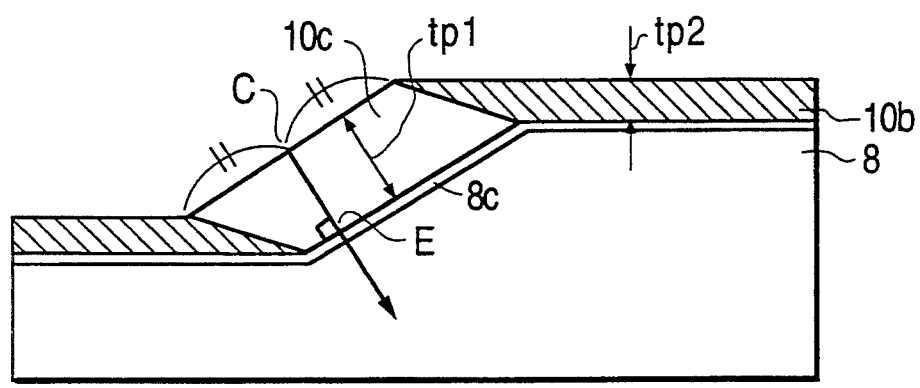

In order to solve the above problem, a thickness ratio of the sloped layer portion to the planar layer portion of the upper clad layer 10 is determined so as to position the point E on the lower sloped portion 8c of the active layer 8. This is illustrated in FIG. 10(b). When thickness tp1 of the sloped portion 10c of the upper clad layer 10 and thickness tp2 of the planar portion 10b thereof are determined as shown in FIG. 10(b) (in other words, thickness tp1 is larger than thickness tp2,) then a vertical line from the point C (C is the middle point of the upper surface of the sloped portion 10c) crosses the sloped portion 8c of the; active layer 8 at point E that is positioned on the lower half of the sloped portion 8c. It is found desirable that the point E is positioned on the lower side of the sloped portion 8c of the active layer 8 as described above. In this case, the lasing center is restricted in the limited area of the lower side of the sloped portion 8c and fluctuation of the lasing center is remarkably reduced.

In order to position the lasing center on the lower side of the sloped portion 8c of the active layer 8, the specific geometrical condition should be satisfied.

Figure 11:
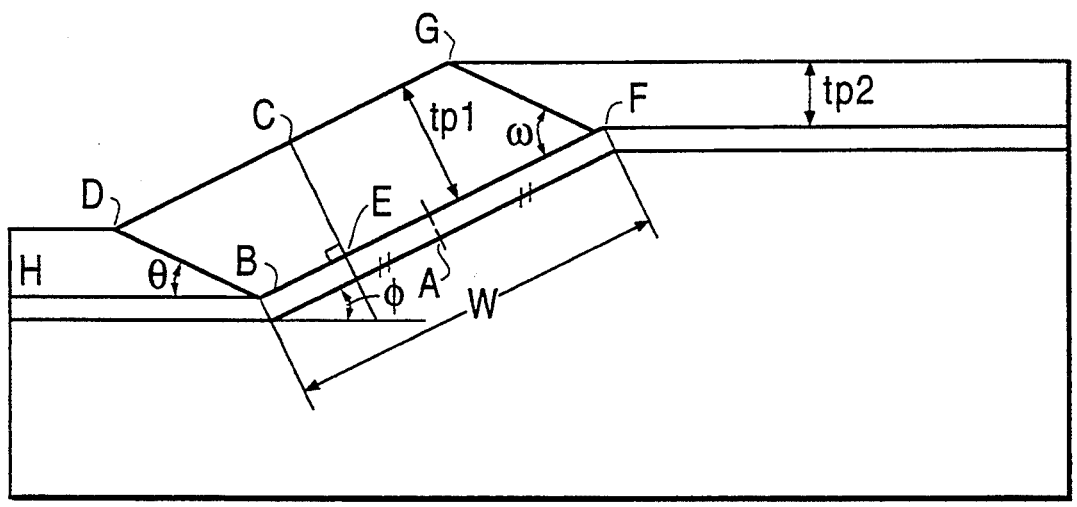

This condition may be found using FIG. 11, in which thickness of the sloped portion 10c is different from that of the planar portion 10b thereof. In FIG. 11, it is assumed that points C and A are the middle points of lines DG and BF respectively; thickness of the sloped portion of layer 10c denoted as tp1; thickness of the planar portion of layer 10b is denoted as tp2; angle between lines BD and BH (angle between growth direction of the sloped layer and planar surface) is $\theta$; inclination angle of the sloped layer is $\phi$; CE is vertical to BF; and width of the sloped portion is W; then we have:

$$R = \sin \phi [(\cos \theta / \sin \theta) + (\cos \phi / \sin \phi)], \quad (4)$$

where R-tp1/tp2.

Condition for making point E coincident with point B is given by $\tan \omega = 2tp1/W$, and condition for making point E coincident with point A is given by $\omega = 90°$, where $\omega = \theta + \phi$.

Hence, the condition that point E exists between points A and B is given by the following condition, $$\tan^{-1}(2tp1/W) \leq \theta + \phi \leq 90°. \quad (5)$$

If $\theta$ and $\omega$ (or $\phi$) are determined to satisfy the above condition (5), then necessary thickness ratio R is given by equation (4).

Next, utilizing the MOVPE method, growth condition which satisfies the thus obtained thickness ratio R (=tp1/tp2) is given by the following relation, $$R = aTg^2 + bTg + c + d\alpha, \quad (6)$$

where Tg denotes a growth temperature of the substrate in °C., and $\alpha$ denotes a source gas ratio V/III, and a, b, c, d are constants shown below a = $1.9999 \times 10^{-4}$
b = $-0.297985$
c = $111.505$
d = $1.6667 \times 10^{-3}$.

Figure 12:
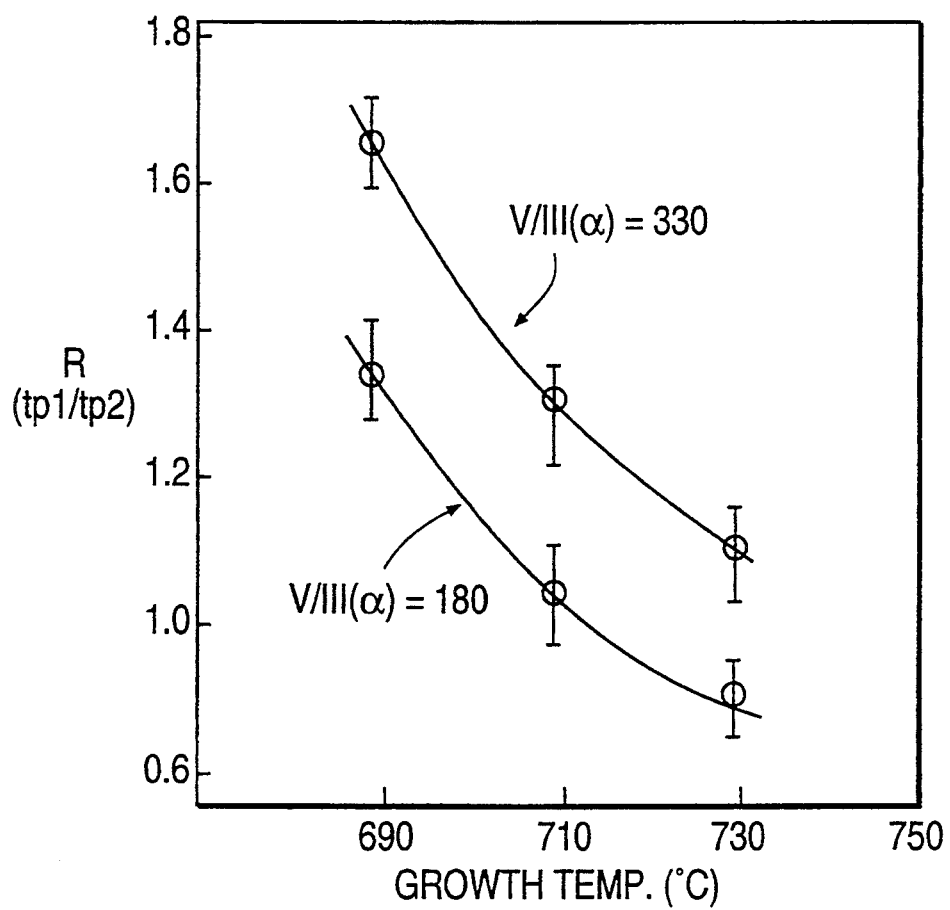

The above condition is measured under the conditions of Pg=50 Torr, E=800 μm/mol and Ft=8 SLM and equation (6) is obtained from experimental data shown in FIG. 12, where the abscissa shows the substrate temperature and the ordinate shows thickness ratio R of the sloped portion (tp1) to the planar portion (tp2) of grown semiconductor layer. In FIG. 12, two curves are shown, one for $\alpha$=180 and the other for 60

=330. Two curves are substantially parallel and may be expressed approximately by a quadratic curve. The equation (6) which expresses the relation between the thickness ratio R and the substrate temperature Tg can be obtained from these curves, thereby the V/III ratio $\alpha$ being used as a parameter.

If the gas pressure Pg (Torr), the growth efficiency E ($\mu$m/mol), and/or the total gas flow Ft (SLM) are changed, $\alpha$ value applied to the above relation (6) is to be modified by inserting the following relation (7). This procedure is completely the same as that applied for modifying $\alpha$ in condition (2) using relation (3), which is described previously.

$$\alpha = 128 \times \alpha' \times Pg/(E \times Ft), \tag{7}$$

where $\alpha'$ denotes V/III ratio which is needed in an actual growth process.

The above relations are obtained for growing semiconductor layer using a phosphine (PH$_3$) gas as a group V source gas, therefore, the above relations can not be applied when an arsine (AsH$_3$) gas is used as a source gas.

First Embodiment

Figure 8A:
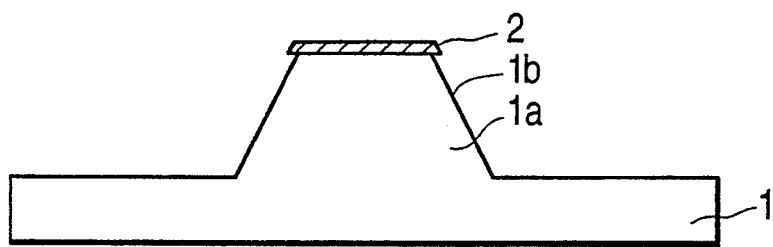
Figure 8B:
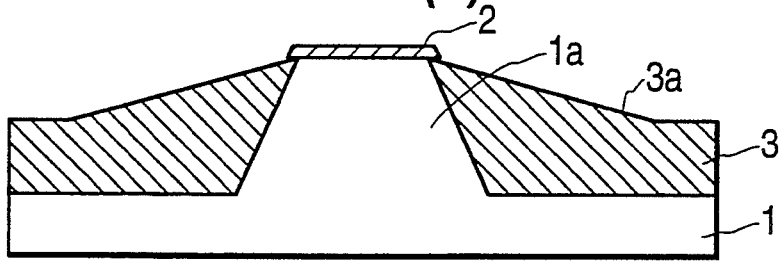
Figure 8C:
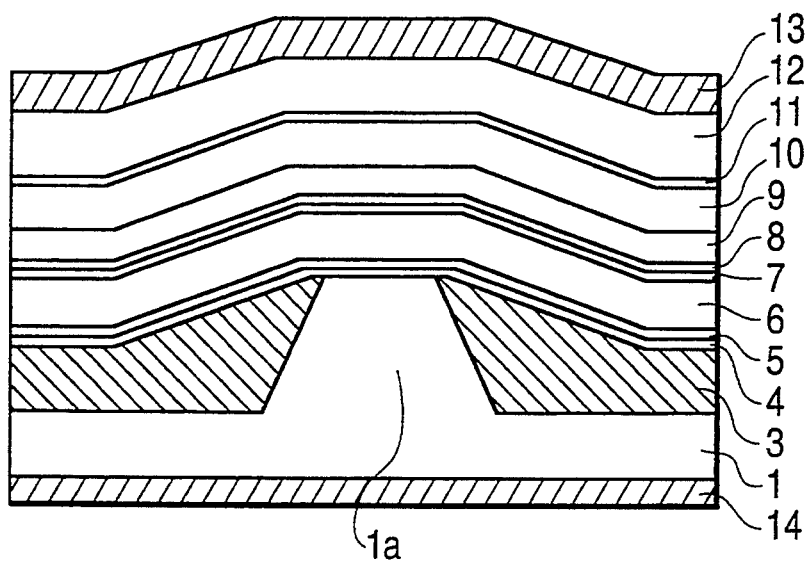

FIGS. 8(a)-8(c) show schematic cross sections at different steps in manufacturing a semiconductor laser in the first species according to the present invention.

In FIG. 8(a), a p-type (100) GaAs substrate 1 (Zn-doped) is prepared. A SiO$_2$ layer 2 is deposited on the substrate 1 by sputtering and thereafter it is selectively patterned so as to form a stripe-shaped SiO$_2$ layer extending in the <110> direction. Using the stripe-shaped SiO$_2$ layer 2 as a mask, the substrate 1 is subjected to mesa-etching. This results in forming the GaAs substrate 1 having a mesa-stripe 1a, and there appear (111)B surfaces on both sides of the mesa-stripe 1a. The height of the mesa-stripe 1a is controlled to be about 1.8 $\mu$m, and the SiO$_2$ mask layer 2 forms a protrusion of about 0.2 $\mu$m in length which projects outwardly from the edge of the top of the mesa-stripe 1a.

Next, as shown in FIG. 8(b), an n-type GaAs current blocking layer 3 (Se-doped) having a thickness of about 1 $\mu$m is grown on the GaAs substrate 1 by a MOVPE method, thereby TMG, AsH$_3$, and SeH$_2$ gases being used as the source gases. A V/III ratio of 80 and a growth temperature of 670° C. are used in this growth. The TMG gas is used in the growth as a Ga source gas with an object of forming a gently sloped flat surface, which is described previously. As the result, the grown current blocking layer 3 has a substantially flat surface 3a which is close to a (411)B surface of (100) GaAs substrate 1, the (411)B surface having an inclination less than that of (311)B surface.

When the SiO$_2$ layer 2 acting as a mask is removed by hydrofluoric acid HF, the patterned-substrate is obtained. In FIG. 8(c), a plurality of semiconductor layers 4 through 11 are grown thereon one after another by the MOVPE method as follows. Through all growth steps, conditions of gas pressure Pg=50 Torr, growth efficiency E=800 $\mu$m/mol, and total gas flow Ft=8 SLM are maintained.

| | Ref. No. | Doping Material | Thickness ($\mu$m) |
|---|---|---|---|
| p-GaAs buffer layer | 4 | Zn | 0.05 |
| p-GaInP lower spike | 5 | Zn | 0.1 |

-continued

| | Ref. No. | Doping Material | Thickness ($\mu$m) |
|---|---|---|---|
| reduction layer | | | |
| p-AlGaInP lower clad layer | 6 | Mg | 0.5 |
| p-AlGaInP spacer layer | 7 | Mg | 0.1 |
| GaInP active layer | 8 | — | 0.08 |
| n-AlGaInP guide layer | 9 | Se | 0.3 |
| n-AlGaInP upper clad layer | 10 | Se | 0.6 |
| n-GaInP upper spike reduction layer | 11 | Se | 0.1 |

For growing these layers, TEG, TMA, TMI, AsH$_3$, PH$_3$, SeH$_2$, DMZn (dimethyl-zinc), (C$_5$H$_5$)$_2$Mg (cyclopentadienyl-magnesium) gases are used as source gases and doping gas. The TMG gas is not used for the growth of these layers, however, the TMG gas may be mixed with the TEG gas during the growth of the lower and upper clad layers 6, 10 in order to modify a shape of the grown layer.

Thereafter, an n-type GaAs contact layer 12 having a thickness of 1 $\mu$m is grown on the above structure, thereby the TMG being used as a Ga source gas in order to obtain the A/B ratio of about 2 or greater than 2 in order to form the flat surface as much as possible, as previously described.

An upper electrode 13 of Au/AuGe is formed on the n-GaAs contact layer 12 and a lower electrode 14 of Au/AuZn is formed on the bottom surface of the p-GaAs substrate 1, completing fabrication of the semiconductor laser shown in FIG. 8(c).

Second Embodiment

Figure 13:
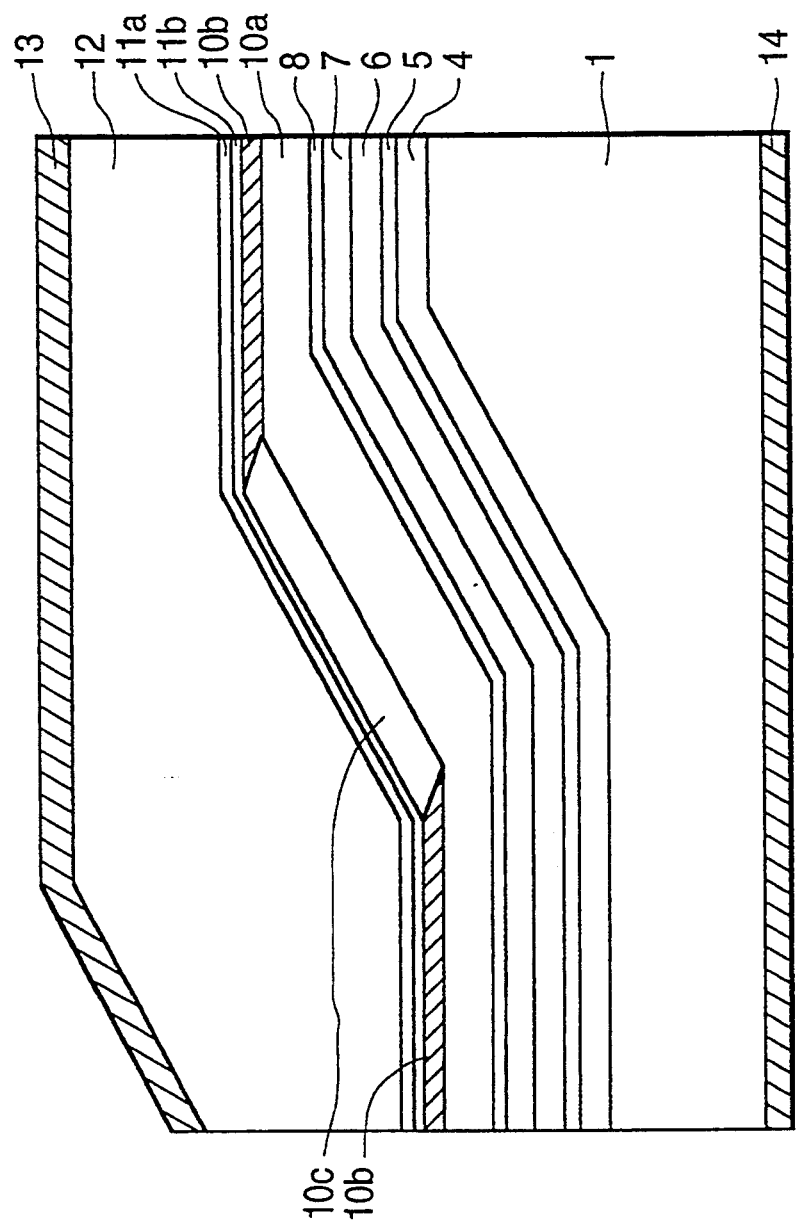

A second embodiment relates to the second species of semiconductor lasers of the patterned substrate type in accordance with the present invention. FIG. 13 shows a schematic cross section of this type of the semiconductor laser. The semiconductor laser of FIG. 13 is manufactured by the following method.

An n-type (100) GaAs substrate 1 (Si-doped) is provided. In the similar way as the embodiment 1, SiO$_2$ mask is formed in the <01$\bar{1}$> direction of the substrate. The substrate is subjected to an etching process forming a sloped portion of a (411)A surface. A depth of the etched portion is about 1 $\mu$m.

After removing the mask, semiconductor layers are grown one by one sequentially on the patterned substrate 1. Throughout the growth, conditions of Pg=50 Torr, E=800 $\mu$m/mol and Ft=8 SLM are maintained using a hydrogen gas as a carrier gas. Other main growth conditions are outlined in the following table.

| | Ref. No. | Doping Material | Thickness ($\mu$m) | Tg, $\alpha$ |
|---|---|---|---|---|
| n-GaAs first buffer layer | 4 | Se | 1.0 | Tg = 670° C. $\alpha$ = 50 |
| n-GaInP second buffer layer | 5 | Se | 0.1 | Tg = 670° C. $\alpha$ = 400 |
| n-AlGaInP lower clad layer | 6 | Se | P:0.3 S:0.6 | Tg = 710° C. $\alpha$ = 300 |
| n-AlGaInP guide layer | 7 | Se | P:0.2 S:0.4 | Tg = 710° C. $\alpha$ = 300 |
| GaInP active layer | 8 | — | P:0.015 S:0.03 | Tg = 710° C. $\alpha$ = 400 |
| P-AlGaInP first upper clad layer | 10a | Mg | P:0.3 S:0.6 | Tg = 710° C. $\alpha$ = 300 |

-continued

| Ref. No. | Doping Material | Thickness (μm) | Tg, α |
|---|---|---|---|
| n p-AlGaInP second upper clad layer | 10b/10c (See remarks 2) | Zn + Se | P:0.2 S:0.4 | Tg = 710° C. α = 300 |
| p-AlGaInP first spike reduction layer | 11a | Mg | 0.04 | Tg = 710° C. α = 300 |
| p-GaInP second spike reduction layer | 11b | Zn | 0.1 | Tg = 710° C. α = 400 |
| p-GaAs contact layer | 12 | Zn | 5 | Tg = 670° C. α = 50 |

Remarks:
(1): In the thickness column, "P:" denotes thickness of the planar portion, "S:" denotes thickness of the sloped portion.
(2): In growing the second upper clad layer, DMZn and SeH$_2$ gases are mixed and used as dopant gases. Since the planar portion and sloped portion of the upper clad layer have different surface indices and activation efficiency of each dopant is different for two surfaces, therefore, this results in growing an n-type AlGaInP layer for the planar portion 10b and a p-type AlGaInP layer for the sloped portion 10c. The n-type AlGaInP planar portion 10b works as a current blocking layer.

Source gases used for growing the above layers are substantially the same as those used in the First Embodiment. TEG, TMA, TMI, AsH$_3$, PH$_3$ are used as source gases and SeH$_2$, DMZn, (C$_5$H$_5$)$_2$Mg are used as doping gases.

After the growth of the above layers 4 through 12, electrodes 13 and 14 are respectively formed on the the upper and lower sides of the grown structure. After cleaving and coating on the end surfaces, semiconductor laser chips are completed.

In the above Second Embodiment, the upper clad layer 10b, 10c has a function of controlling the lasing current; however, this function is not limited to the upper clad layer 10b, 10c, but the same function can be obtained with regard to the lower clad layer 6 instead of the upper clad layer 10b, 10c.

The present invention may be embodied in other specific forms. The presently disclosed embodiment is, therefore, to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. A semiconductor laser comprising:
a patterned-substrate having first and second planar portions in a parallel and spaced relationship and a sloped portion extending between the first and second planar portions;
an active layer on the patterned-substrate;
a clad layer on the active layer, the clad layer comprising first and second current-blocking regions corresponding, respectively, to the first and second planar portions of the patterned-substrate, and a current channel region corresponding to the sloped portion of the patterned-substrate and extending between the first and second current-blocking regions, the current channel having a thickness tp1 and the current-blocking regions each having a thickness tp2; wherein
a thickness ratio R=(tp1/tp2) satisfies the following relationship:

$$R = \sin\phi\{(\cos\theta/\sin\theta) + (\cos\phi/\sin\phi)\}$$

where $\theta$ and $\phi$ are selected within a range specified by the following condition:

$$\tan^{-1}(2p1/W) \leq \theta + \phi \leq 90°$$

where $\phi$ is defined as an inclination angle of the current channel region with respect to the first planar portion of the patterned-substrate, and $\theta$ is defined as an angle between the growth direction of the clad layer and the first planar portion of the patterned-substrate, and W is defined as the width of the current channel region.

2. A semiconductor laser as recited in claim 1, wherein the first and second planar portions of the patterned-substrate each have a surface index (100) and the sloped portion of the patterned-substrate extends in the direction <01$\bar{1}$>.

3. A semiconductor laser as recited in claim 1, wherein the sloped portion of the patterned-substrate has a surface index (411)A.

4. A semiconductor laser as recited in claim 1, wherein the active layer is of GaInP.

5. A semiconductor laser as recited in claim 1, in which the clad layer represents an upper clad layer, the semiconductor laser further comprising a lower clad layer positioned between the active layer and the patterned-substrate.

6. A semiconductor laser comprising:
a patterned-substrate having a planar surface with a mesa-stripe formed on a portion of the planar surface to define an exposed planar surface, the mesa-stripe having a top portion and side surfaces extending from the top portion to the exposed planar surface, each side surface having a first inclination angle with respect to the exposed planar surface;
a current blocking layer on the side surfaces of the mesa-stripe and the exposed planar surface of the patterned-substrate, the current blocking layer having sloped portions corresponding to the side surfaces of the mesa-stripe, the sloped portions having a lower surface which defines an interface with the side surfaces of the mesa-stripe and an upper surface which forms a second inclination angle with respect to the exposed planar surface of the patterned-substrate, the second inclination angle being less than the first inclination angle;
a plurality of layers formed on the sloped portions of the current-blocking layer and the top portion of the mesa-stripe, the plurality of layers comprising;
a buffer layer having a thickness of tp1 on the sloped portion of the current-blocking layer and a thickness tp2 on the top portion of the mesa-stripe, a thickness ratio tp1/tp2 being less than 1,
a lower clad layer formed on the buffer layer and having a thickness tp1' on the sloped portion of the current-blocking layer and a thickness tp2' on the top portion of the mesa-stripe, a thickness ratio tp1'/tp2' ranging approximately between 1 and 2,
an active layer formed on the lower clad layer, and
an upper clad layer formed on the active layer.

* * * * *

UNITED STATES PATENT AND TRADEMARK OFFICE
CERTIFICATE OF CORRECTION

PATENT NO. : 5,375,136
DATED : December 20, 1994
INVENTOR(S) : Chikashi ANAYAMA, et al.

It is certified that error appears in the above-indentified patent and that said Letters Patent is hereby corrected as shown below:

Under "[57] ABSTRACT", line 6 (as counted), delete "preferably" and insert therefor --preferable--.
Col. 1, line 61, after "having", insert --a--.
Col. 2, line 66, after "Thus", insert a comma (",").
Col. 8, line 9, delete the semicolon (";");
    Line 25, after "10c", insert --is--;
    Line 34, delete "R-tp1/tp2" and insert therefor --R=tp1/tp2--;
    Line 68, delete "60" and insert therefor --α-- (alpha symbol).
Col. 10, line 68, delete "P-AlGaInP" and insert therefor --p-AlGaInP--.
Col. 12, line 6, delete "tan$^{-1}$(2p1/W)$\leq\theta+\phi\leq$90°" and insert therefor --tan$^{-1}$(2tp1/W)$\leq\theta+\phi\leq$90°--;
    Line 51, delete the semicolon (";") and insert therefor a colon (":").

Signed and Sealed this

Twenty-third Day of May, 1995

Attest:

BRUCE LEHMAN

*Attesting Officer*     *Commissioner of Patents and Trademarks*